(12) United States Patent
Burroughes

(10) Patent No.: US 7,091,516 B2
(45) Date of Patent: Aug. 15, 2006

(54) OPTOELECTRONIC DEVICES

(75) Inventor: Jeremy H Burroughes, Cambridge (GB)

(73) Assignee: Cambridge Display Technology Limited, Cambridge (GB)

(*) Notice: Subject to any disclaimer, the term of this patent is extended or adjusted under 35 U.S.C. 154(b) by 334 days.

(21) Appl. No.: 10/203,683

(22) PCT Filed: Feb. 7, 2001

(86) PCT No.: PCT/GB01/00496

§ 371 (c)(1),
(2), (4) Date: Aug. 9, 2002

(87) PCT Pub. No.: WO01/59854

PCT Pub. Date: Aug. 16, 2001

(65) Prior Publication Data

US 2003/0039803 A1    Feb. 27, 2003

(30) Foreign Application Priority Data

Feb. 9, 2000  (GB) .................................. 0002958.7

(51) Int. Cl.
*H01L 35/24* (2006.01)

(52) U.S. Cl. .................. 257/40; 257/184; 257/461; 257/431; 438/82; 438/99

(58) Field of Classification Search ........ 257/213–235, 257/80, 95, 85, 87, 96, 40, 184, 461, 431; 438/22–28, 46, 4, 82, 99
See application file for complete search history.

(56) References Cited

U.S. PATENT DOCUMENTS 5,313,484 A * 5/1994 Arimoto ...................... 372/46
5,315,129 A    5/1994 Forrest et al.
5,350,459 A * 9/1994 Suzuki et al.
5,670,791 A * 9/1997 Halls et al. .................... 257/40
6,278,153 B1 * 8/2001 Kikuchi et al. ............. 257/310
6,830,833 B1 * 12/2004 Li

FOREIGN PATENT DOCUMENTS

EP        0 252 756        1/1988

(Continued)

OTHER PUBLICATIONS

Ke Xiao et al: "High Photovoltage Multilayer Organic Dye Photocells", Electrochimica Acta, GB, Elsevier Science Publishers, Barking, vol. 38, No. 2/03, Feb. 01, 1993, pp. 459-464, XP000345139, ISSN: 0013-4686 (the whole document).

(Continued)

*Primary Examiner*—Fetsum Abraham
(74) *Attorney, Agent, or Firm*—Harness, Dickey & Pierce, PLC

(57) ABSTRACT

An optoelectronic device comprising a photoresponsive region located between first and second electrodes such that charge carriers can move between the photoresponsive region and the first and second electrodes, the photoresponsive region comprising: a stack of alternate first and second layers, each first layer comprising a first photoresponsive material and each second layer comprising a second photoresponsive material, the first and second photoresponsive materials having different electron affinities; wherein each pair of second layers on opposite sides of a first layer contact each other via first holes defined by said first layer between said pair of second layers, and each pair of first layers on opposite sides of a second layer contact each other via second holes defined by said second layer between said pair of first layers.

18 Claims, 2 Drawing Sheets

FOREIGN PATENT DOCUMENTS

Figure 1:
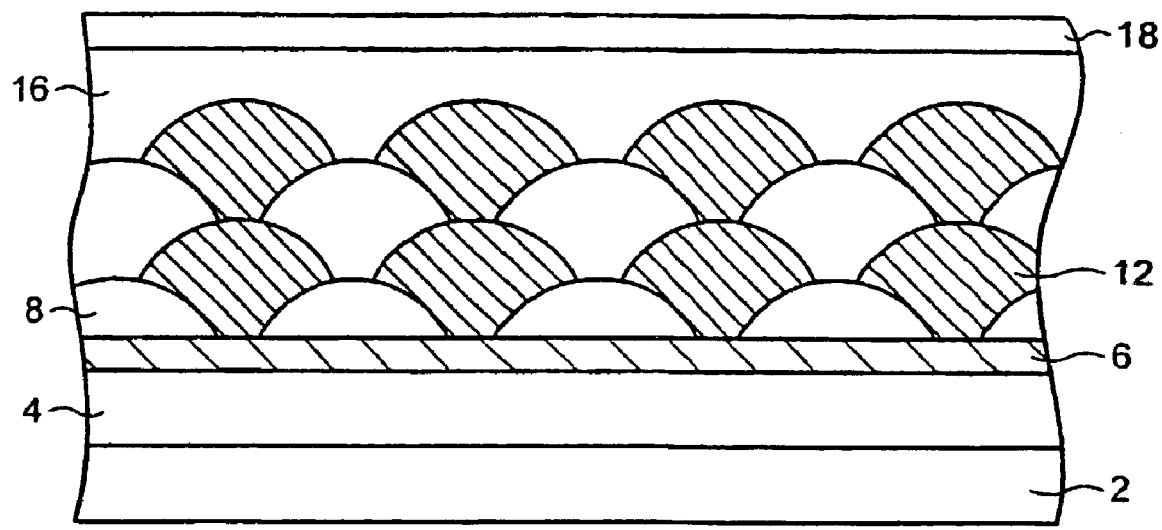

| | | |
|---|---|---|
| EP | 0 224 189 | 3/1992 |
| WO | 95 27314 | 10/1995 |
| WO | 99/49525 | 3/1998 |
| WO | 99 49525 | 9/1999 |
| WO | 00 33396 | 6/2000 |

OTHER PUBLICATIONS

Forrest S. R., et al.: "Optoelectronic Device Applications of Organic Thin Film Semiconductors", Lasers and Electro-Optics Society Annual Meeting Conference Proceedings, (LEOS), US, New York, IEEE, vol. Conf. 2, Oct. 17, 1989, pp. 202-206, 79, XP000131058 (the whole document).

Masahiro Hiramoto et al: "P-I-N Like Behivior in a Three-Layered Organic Solar Cells Having a Co-Deposited Interlayer of Pigments" Journal of Applied Physics, US, American Institute of Physics, New York, vol. 72, No. 8, Oct. 15, 1992, pp. 3781-3787, XP000312342, ISSN: 0021-8979 (the whold document).

Halls, J.J.M. et al.: "Efficient Photodiodes from Interpenetrating Polymer Networks", Nature, MacMillan Journals Ltd., London, GB, vol. 376, Aug. 10, 1995, pp. 498-500, XP000578123, ISSN: 0028-0836 (the whole document).

International Search Report—PCT/GB01/00496, ISA/EPO, Jul. 12, 2001.

Search Report Under Section 17, Application No. GB 0002958.7, UK Patent Office, Jun. 20, 2001.

* cited by examiner

OPTOELECTRONIC DEVICES

The present invention relates to optoelectronic devices which comprise a photoresponsive region and in particular to devices intended to detect light such as photodetectors and to devices intended to provide a source of electrical energy from electromagnetic radiation such as solar cells.

A photodetector or a solar cell typically comprises a photoresponsive material located between two electrodes, wherein the electric potential between the two electrodes changes when the photoresponsive material is exposed to light.

U.S. Pat. No. 5,670,791 discloses a polymeric photodetector comprising a layer of a blend of poly(2-methoxy-5 (2'-ethyl)hexyloxyphenylenevinylene) ("MEH-PPV") and poly(cyanophenylene-vinylene) ("CN-PPV") located between an indium-tin oxide (ITO) electrode and an aluminum electrode.

Relatively good device efficiencies have been achieved with these devices, but there is a demand for photodetectors having even higher device efficiencies.

It is therefore an aim of the present invention to provide a photoresponsive device having an improved device efficiency.

According to a first aspect of the present invention, there is provided an optoelectronic device comprising a photoresponsive region located between first and second electrodes such that charge carriers can move between the photoresponsive region and the first and second electrodes, the photoresponsive region comprising: a stack of alternate first and second layers, each first layer comprising a first photoresponsive material and each second layer comprising a second photoresponsive material, the first and second photoresponsive materials having different electron affinities; wherein each pair of second layers on opposite sides of a first layer contact each other via first holes defined by said first layer between said pair of second layers, and each pair of first layers on opposite sides of a second layer contact each other via second holes defined by said second layer between said pair of first layers.

According to one embodiment, the first electrode is adjacent one of said first layers and the second electrode is adjacent one of said second layers.

The first holes defined by each first layer between each pair of second layers are preferably arranged in an ordered array, and the second holes defined by each second layer between each pair of first layers are also preferably arranged in an ordered array.

Preferably, both the first and second photoresponsive materials are semi-conductive conjugated polymers.

According to one embodiment, each first layer between a pair of second layers comprises a blend of the first and second photoresponsive materials, the proportion of first photoresponsive material being higher than the proportion of second photoresponsive material; and each second layer between a pair of first layers also comprises a blend of the first and second photoresponsive materials, the proportion of second photoresponsive material being higher than the proportion of the first photoresponsive material.

According to a second aspect of the present invention, there is provided a method of producing an optoelectronic device comprising a photoresponsive region located between first and second electrodes such that charge carriers can move between the photoresponsive region and the first and second electrodes, wherein said photoresponsive region is formed by a process comprising the steps of: depositing an array of first regions on a substrate comprising the first electrode, wherein the array of first regions define holes therebetween exposing portions of the underlying substrate; and depositing an array of second regions in the holes defined between the first regions such that the second regions partially overlap the first regions, and define holes therebetween exposing the portions of the underlying first regions; wherein the first regions comprise a first photoresponsive material and the second regions comprise a second photoresponsive material, the first photoresponsive material and second photoresponsive material having different electron affinities.

According to a preferred embodiment, the array of first regions define an array of distinct holes, and the array of second regions define an array of distinct holes.

According to a preferred embodiment, the arrays of first and second regions are deposited by an ink-jet printing technique.

According to a third aspect of the present invention, there is provided an optoelectronic device comprising a photoresponsive region located between first and second electrodes such that charge carriers can move between the photoresponsive region and the electrodes; the photoresponsive region comprising at least first and second blend layers each comprising a blend of a first photoresponsive material and a second photoresponsive material having differing electron affinities, wherein the first and second blend layers comprise different proportions of the first and second photoresponsive materials.

Preferably, at least one of the photoresponsive materials is a semi-conductive conjugated polymer, and further preferably, both of the photoresponsive materials are semi-conductive conjugated polymers.

According to a preferred embodiment, the photoresponsive region comprises a stack of alternating first and second blend layers.

The photoresponsive region preferably further comprises a layer consisting essentially of the first photoresponsive material adjacent the first electrode, and/or a layer consisting essentially of the second photoresponsive material adjacent the second electrode. These layers facilitate the transport of the respective charge carriers into the first and second electrodes.

Figure 2A:
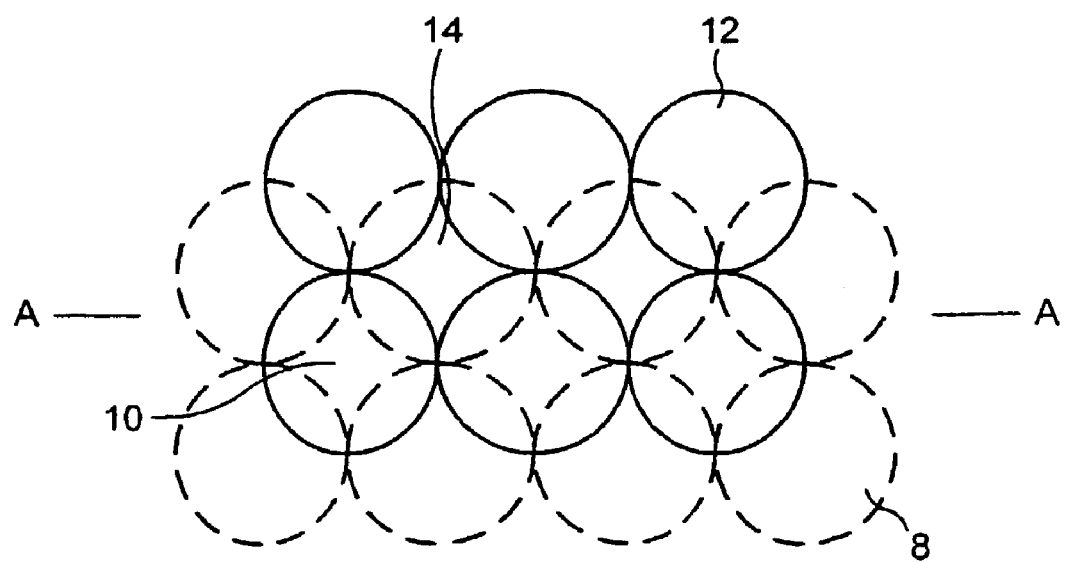
Figure 2B:
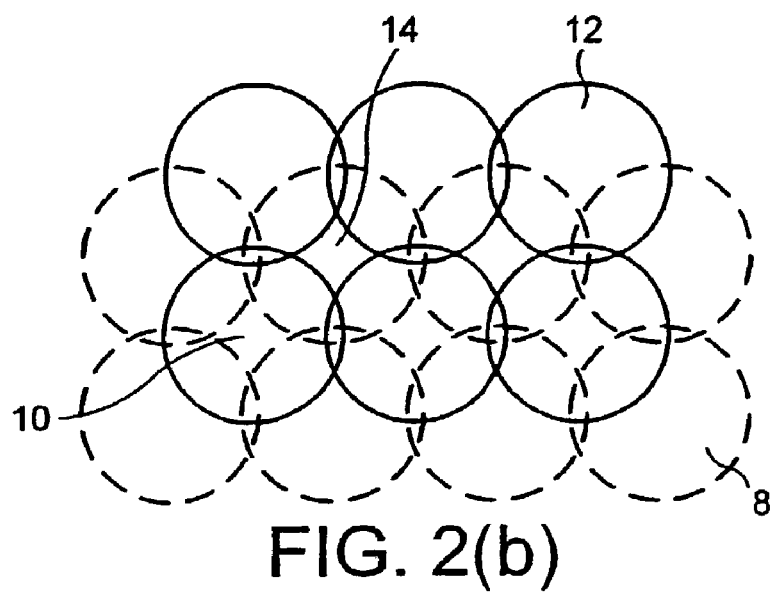
Figure 3:
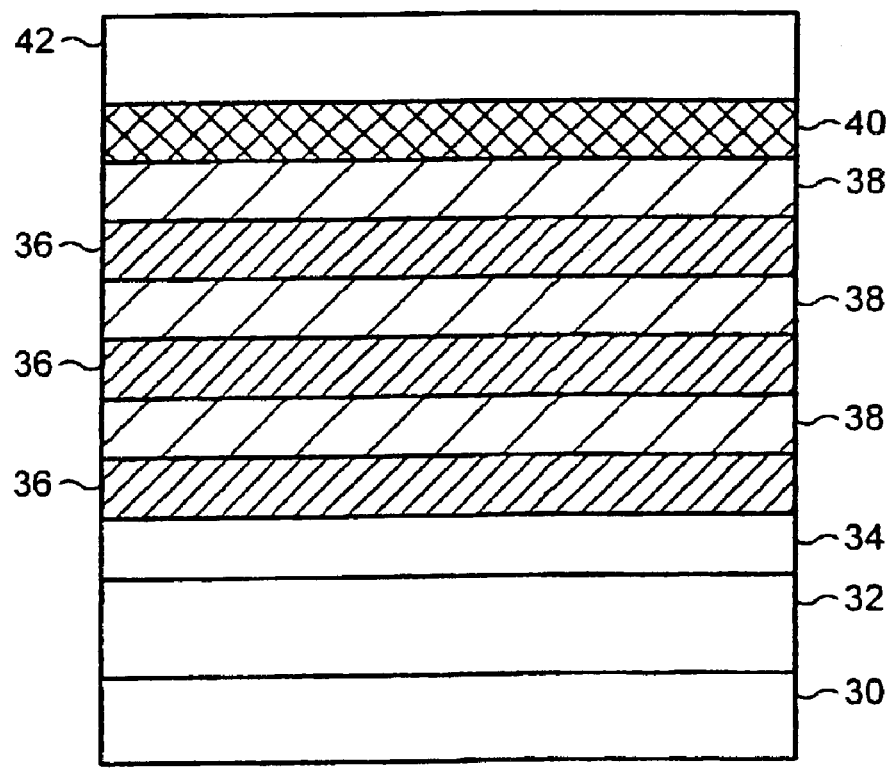

Embodiments of the invention shall be described hereunder, by way of example, only, with reference to the accompanying drawings, in which:

FIG. 1 is a schematic partial cross-sectional view of an optoelectronic device according to a first embodiment of the present invention;

FIGS. 2(a) and 2(b) show the relationship between adjacent layers of the device shown in FIG. 1; and FIG. 3 is a schematic view of an optoelectronic device according to a second embodiment of the present invention.

With reference to FIGS. 1, 2(a) and 2(b), a method for producing an optoelectronic device according to a first embodiment of the present invention is described below. A glass base 2 is coated with a layer of indium tin oxide (ITO) to provide an anode layer 4. Next, a continuous layer of MEH-PPV 6 is deposited on the surface of the ITO layer opposite the glass substrate by a standard deposition technique such as blade-coating, spin-coating or an ink-jet printing technique. The MEH-PPV layer 6 has a thickness in the range of 5 to 100 nm, preferably 5 to 20 nm. Next, an ink-jet printing technique is used to deposit an array droplets of a solution of CN-PPV in an appropriate solvent on me surface of the MEH-PPV layer opposite the ITO layer.

The volume of each droplet and the spacing of the droplets are controlled such that after drying to evaporate She solvent, there remains a layer of CN-DPV spots 8 left on the MEH-PPV layer which contact each other (as shown in FIG. 1a) or overlap each other (as shown in FIG. 2b) at their circumference but also define distinct holes 10 therebetween which expose portions of the underlying MEH-PPV layer 6. The outline of the CN-PPV spots 8 are shown by broken lines in FIGS. 2(a) and 2(b). Next, an ink-jet printing technique is used to deposit an array of droplets of a solution of MEH-PPV in an appropriate solvent on the layer of CN-PPV spots 8 such that after drying to evaporate solvent, there remains a layer of MEH-PPV spots 12 which fill the roles 10 defined by the underlying array of CN-PPV spots 8 and partially cover the underlying CN-PPV spots 8 and define an array of distinct holes 14 therebetween which expose portions of the underlying CN-PPV spots 8. The MEH-PPV spots 12 (as shown by full lines in FIGS. 2(a) and 2(b)) also contact wait each other (as shown in FIG. 2(a)) or overlap with each other (as shown in FIG. 2(b)) at their circumference.

Examples of suitable solvents for the solutions of MEH-PPV and CN-PPV include xylene, toluene and THF. It is preferable to use the same solvent for both MEH-PPV and CN-PPV with a view to achieving some intermixing. Each layer should be dried before deposition of the next layer.

This procedure is repeated to produce an alternating stack of layers of CN-PPV and MEH-PPV spots of the desired thickness, with a layer of MEH-PPV spots as the top layer. The stack preferably has a thickness corresponding to an optical density of between 1 and 3. The thickness of the stack is preferably in the range of 100 to 400 nm.

Next, a continuous layer of CN-PPV 16 is deposited on the top layer of MEH-PPV spots 12 by a standard technique such as blade-coating, spin-coating or an ink-jet printing technique, and a cathode 18 is formed on the surface of the continuous layer of CN-PPV opposite the top layer of MEH-PPV spots. The cathode 18 preferably comprises a layer of aluminum or has a bi-layer structure comprising an underlying thin layer of a metal having a low work function such as calcium and an overlying thicker layer of aluminum.

For the sake of simplicity, FIG. 1 shows a schematic partial cross-sectional view of a device having only two layers of MEH-PPV spots 12 and two layers of CN-PPV spots 8 wherein the layers of spots have the pattern generally shown in FIG. 2(a). FIG. 1 is a schematic partial cross-sectional view taken through line A—A in FIG. 2(a).

In an alternative modification, the MEH-PPV spots 8 could be replaced by MEH-PPV/CN-PPV spots comprising a blend of a major proportion of MEH-PPV and a minor proportion of CN-PPV. Similarly, the CN-PPV spots 12 could be replaced by CN-PPV/MEH-PPV spots comprising a blend of a major proportion of CN-PPV and a minor proportion of MEH-PPV.

In the product device, the thickness of the spots is in the range of 5 nm to 1000 nm, preferably 5 nm to 20 nm, and the diameter of the spots is in the range of 0.5 to 1000 microns, preferably 5 to 50 microns.

The close proximity of photoresponsive materials having differing electron affinities ensures efficient charge separation when an exciton is formed within the photoresponsive region upon exposure of the photoresponsive region to light. The thickness of the spots is preferably made as small as possible to minimise the lateral diffusion length i.e. the distance that a charge carrier needs to travel before collection in an area of high or low electron affinity, as the case may be, to thereby maximise the device efficiency.

The use of an ink-jet printing technique to deposit the ordered array of droplets means that droplets of very small size can be deposited resulting in an ordered array of regions of different photoresponsive materials having a very small size, thereby making it possible to produce a device having a very good device efficiency.

Furthermore, the feature that the array of CN-PPV and MEH-PPV spots is ordered ensures that the lateral diffusion length is uniformly small wherever the exciton is formed within the photoresponsive region, thereby ensuring that the device exhibits a uniform sensitivity across the whole area of the photoresponsive region.

As described above, the alternate two-dimensional ordered arrays of MEH-PPV spots and CN-PPV spots are staggered, resulting in paths from each MEH-PPV spot to the anode which only pass through MEH-PPV, and paths from each CN-PPV spot to the cathode which only pass through CN-PPV. The provision of such paths increases the efficiency of collection of the respective charge carriers by the anode and cathode, respectively, thereby further maximising the efficiency of the device.

Next, with reference to FIG. 3, a second embodiment of the present invention will be described.

A layer of MEH-PPV 34 is deposited on a glass base 30 provided with an anode layer 32. The anode layer 32 is typically a layer of ITO. A layer of a CN-PPV/MEH-PPV blend 36 comprising a major proportion of CN-PPV and a minor proportion of MEH-PPV is deposited on the MEH-PPV layer 34. The proportional ratio of MEH-PPV to CN-PPV is preferable in the range of 5:95 to 40:60. In this embodiment, the ratio is 20:80. Next, a layer 38 of a MEH-PPV/CN-PPV blend comprising a major proportion of MEH-PPV and a minor proportion of CN-PPV is deposited on the underlying CN-PPV/MEH-PPV layer 36. The proportional ratio of MEH-PPV to CN-PPV is preferably in the range of 95:5 to 60:40. In this embodiment, the ratio is 80:20. This deposition of alternating CN-PPV/MEH-PPV and MEH-PPV/CN-PPV blend layers is repeated until a stack of the desired number of layers is achieved with the top layer being a MEH-PPV/CN-PPV blend layer. Next, a layer consisting of CN-PPV is formed on the top MEH-PPV/CN-PPV blend layer, followed by the formation of a cathode 42 on the surface of the CN-PPV layer 40. The cathode typically comprises one or more metal layers. In a preferred embodiment, it comprises a thin layer of a metal having a low work function such as calcium and an overlying layer of aluminum.

In the final device, the MEH-PPV layer and the CN-PPV layer adjacent the anode and cathode, respectively have a thickness in the range of 5 to 3000 Å, preferably 50 to 150 Å, and the MEH-PPV/CN-PPV and CN-PPV/MEH-PPV blend layers have a thickness in the range of 5 to 3000 Å, preferably 50 to 150 Å.

The stack preferably has a total thickness sufficient to absorb about at least 50% of light passing through the stack having a wavelength in the range of 350 to 800 nm. If, for example, the device is then provided with a high reflectivity cathode, about 75% or greater of light incident on the stack will be absorbed as incident light which is not absorbed by the stack on the first pass is reflected back through the stack. Preferably, the stack has a total thickness sufficient to absorb about 90% of the light.

Any polymer deposition technique such as spin-coating or blade-coating can be used to deposit the polymer and polymer blend layers. An ink-jet printing technique is preferred because it can be used to produce layers of very small thicknesses.

In the embodiments described above, MEH-PPV and CN-PPV have been used as photoresponsive materials having different electron affinities. However, it will be understood to the person skilled in the art that the present invention is not limited to the use of these specific materials but is generally applicable to any appropriate combination of photoresponsive materials having different electron affinities.

The invention claimed is:

1. An optoelectronic device comprising a photoresponsive region located between first and second electrodes such that charge carriers can move between the photoresponsive region and the first and second electrodes, the photoresponsive region comprising: first and second layers alternately stacked in a direction extending between the first and second electrodes, each first layer comprising a first photoresponsive material and each second layer comprising a second photoresponsive material, the first and second photoresponsive materials having different electron affinities; wherein each pair of second layers on opposite sides of a first layer contact each other via first holes defined by said first layer between said pair of second layers, and each pair of first layers on opposite sides of a second layer contact each other via second holes defined by said second layer between said pair of first layers.

2. An optoelectronic device according to claim 1 wherein the first electrode is adjacent one of said first layers and the second electrode is adjacent one of said second layers.

3. An optoelectronic device according to claim 1 wherein the first holes defined by each first layer between each pair of second layers are arranged in an ordered array.

4. An optoelectronic device according to claim 1 wherein the second holes defined by each second layer between each pair of first layers are arranged in an ordered array.

5. An optoelectronic device according to claim 1 wherein each first layer between a pair of second layers comprises an ordered array of interconnecting first regions which define said first holes therebetween, and each second layer between a pair of first layers comprises an ordered array of interconnecting second regions which define said second holes therebetween.

6. An optoelectronic device according to claim 1, wherein each first layer between a pair of second layers comprises a blend of the first and second photoresponsive materials, the proportion of first photoresponsive material being higher than the proportion of second photoresponsive material; and each second layer between a pair of first layers also comprises a blend of the first and second photoresponsive materials, the proportion of second photoresponsive material being higher than the proportion of the first photoresponsive material.

7. An optoelectronic device according to claim 1 wherein the first photoresponsive material and second photoresponsive material are semi-conducting conjugated polymers.

8. A method of producing an optoelectronic device comprising a photoresponsive region located between first and second electrodes such that charge carriers can move between the photoresponsive region and the first and second electrodes, wherein said photoresponsive region is formed by a process comprising the steps of:
  depositing an array of first regions on a substrate comprising the first electrode, wherein the array of first regions define holes therebetween exposing portions of the underlying substrate; and
  depositing an array of second regions in the holes defined between the first regions such that the second regions partially overlap the first regions and define holes therebetween exposing the portions of the underlying first regions;
  wherein the first regions comprise a first photoresponsive material and the second regions comprise a second photoresponsive material, the first photoresponsive material and second photoresponsive materials having different electron affinities.

9. A method according to claim 8 wherein the array of first regions define an array of distinct holes.

10. A method according to claim 8 wherein the second regions define an array of distinct holes.

11. A method according to claim 8 wherein the process of forming the photoresponsive region further comprises the step of forming an array of third regions comprising the first photoresponsive material in the holes defined by the array of second regions such that the third regions partially overlap the second regions and define holes therebetween exposing portions of the underlying second regions.

12. A method according to claim 8 wherein the process of forming the photoresponsive region further comprises the step of forming an array of fourth regions comprising the second photoresponsive material in the holes defined by the third regions such that the fourth regions partially overlap the third regions and define holes therebetween exposing portions of the underlying third regions.

13. A method according to claim 8 wherein the substrate comprising the first electrode further comprises a continuous layer of the second photoresponsive material, and the first regions are formed on the continuous layer of the second photoresponsive material.

14. A method according to claim 13 wherein the photoresponsive region further comprises a continuous layer of first photoresponsive material adjacent the second electrode.

15. An optoelectronic device comprising a photoresponsive region located between first and second electrodes such that charge carriers can move between the photoresponsive region and the electrodes; the photoresponsive region comprising at least first and second blend layers each comprising a blend of a first photoresponsive material formed from a semi-conductive conjugated polymer having a first electron affinity and a second photoresponsive material having a differing electron affinity, wherein the first and second blend layers comprise different proportions of the first and second photoresponsive materials.

16. An optoelectronic device comprising a photoresponsive region located between first and second electrodes such that charge carriers can move between the photoresponsive region and the electrodes; the photoresponsive region comprising a stack of alternating first and second blend layers each comprising a blend of a first photoresponsive material and a second photoresponsive material having differing electron affinities, with at least one blend layer being formed from a semi-conductive conjugated polymer, wherein the first and second blend layers comprise different proportions of the first and second photoresponsive materials.

17. An optoelectronic device comprising a photoresponsive region located between first and second electrodes such that charge carriers can move between the photoresponsive region and the electrodes; the photoresponsive region comprising at least first and second blend layers each comprising a blend of a first photoresponsive material formed from a semi-conductive conjugated polymer having a first electron affinity and a second photoresponsive material having a differing electron affinity, wherein the first and second blend layers comprise different proportions of the first and second photoresponsive materials and a layer consisting essentially of the first photoresponsive material is disposed adjacent the first electrode.

18. An optoelectronic device comprising a photoresponsive region located between first and second electrodes such that charge carriers can move between the photoresponsive region and the electrodes; the photoresponsive region comprising at least first and second blend layers each comprising a blend of a first photoresponsive material formed from a semi-conductive conjugated polymer having a first electron affinity and a second photoresponsive material having a differing electron affinity, wherein the first and second blend layers comprise different proportions of the first and second photoresponsive materials and a layer consisting essentially of the second photoresponsive material is disposed adjacent the second electrode.

* * * * *